United States Patent
Adamovich et al.

(10) Patent No.: US 11,594,697 B2
(45) Date of Patent: *Feb. 28, 2023

(54) NON-BLOCKED PHOSPHORESCENT OLEDS

(71) Applicant: Universal Display Corporation, Ewing, NJ (US)

(72) Inventors: Vadim Adamovich, Yardley, PA (US); Michael Stuart Weaver, Princeton, NJ (US); Raymond Kwong, Fo Tan (HK)

(73) Assignee: Universal Display Corporation, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/145,710

(22) Filed: Jan. 11, 2021

(65) Prior Publication Data
US 2021/0135143 A1    May 6, 2021

Related U.S. Application Data

(63) Continuation of application No. 16/781,173, filed on Feb. 4, 2020, now Pat. No. 10,916,721, which is a (Continued)

(51) Int. Cl.
*H01L 51/50* (2006.01)
*H01L 51/00* (2006.01)

(52) U.S. Cl.
CPC ...... *H01L 51/5016* (2013.01); *H01L 51/5048* (2013.01); *H01L 51/5056* (2013.01);
(Continued)

(58) Field of Classification Search
CPC ............... H01L 51/5004; H01L 2251/553
See application file for complete search history.

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| EP | 1238981 A2 | 9/2002 |
| EP | 1493797 A1 | 1/2005 |

(Continued)

OTHER PUBLICATIONS

Adachi et al., "Architectures for Efficient Electrophosphorescent Organic Light-Emitting Devices," IEEE J. on Selected Tops in Quantum Elec., vol. 8, No. 2, 372-377 (2002).

(Continued)

*Primary Examiner* — Robert A Vetere
(74) *Attorney, Agent, or Firm* — Butzel Long

(57) ABSTRACT

An organic light emitting diode (OLED) architecture in which efficient operation is achieved without requiring a blocking layer by locating the recombination zone close to the hole transport side of the emissive layer. Aryl-based hosts and Ir-based dopants with suitable concentrations result in an efficient phosphorescent OLED structure. Previously, blocking layer utilization in phosphorescent OLED architectures was considered essential to avoid exciton and hole leakage from the emissive layer, and thus keep the recombination zone inside the emissive layer to provide high device efficiency and a pure emission spectrum.

20 Claims, 14 Drawing Sheets

Related U.S. Application Data continuation of application No. 14/174,456, filed on Feb. 6, 2014, now Pat. No. 10,593,900, which is a continuation of application No. 12/887,840, filed on Sep. 22, 2010, now Pat. No. 8,685,540, which is a continuation of application No. 11/110,776, filed on Apr. 21, 2005, now Pat. No. 7,807,275.

(52) U.S. Cl.
CPC ...... *H01L 51/5072* (2013.01); *H01L 51/0052* (2013.01); *H01L 51/0085* (2013.01); *Y10S 428/917* (2013.01); *Y10T 428/24942* (2015.01)

(56) References Cited

U.S. PATENT DOCUMENTS

| | | | |
|---|---|---|---|
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,310,360 B1 | 10/2001 | Forrest | |
| 6,337,102 B1 | 1/2002 | Forrest | |
| 6,420,031 B1 | 7/2002 | Parthasarathy | |
| 6,468,819 B1 | 10/2002 | Kim | |
| 6,469,437 B1 | 10/2002 | Parthasarathy | |
| 6,548,956 B2 | 4/2003 | Forrest | |
| 6,576,134 B1 | 6/2003 | Agner | |
| 6,576,136 B1 | 6/2003 | Agner | |
| 6,602,540 B2 | 8/2003 | Gu | |
| 6,830,828 B2 | 12/2004 | Thompson | |
| 6,835,469 B2 | 12/2004 | Kwong | |
| 6,902,833 B2 | 6/2005 | Thompson | |
| 7,279,704 B2 | 10/2007 | Walters | |
| 7,431,968 B1 | 10/2008 | Shtein | |
| 7,807,275 B2 * | 10/2010 | Adamovich | H01L 51/5016 428/917 |
| 7,968,146 B2 | 6/2011 | Wagner | |
| 8,685,540 B2 * | 4/2014 | Adamovich | H01L 51/5056 428/917 |
| 10,593,900 B2 * | 3/2020 | Adamovich | H01L 51/5048 |
| 10,916,721 B2 * | 2/2021 | Adamovich | H01L 51/5056 |
| 2002/0034656 A1 | 3/2002 | Thompson | |
| 2002/0071963 A1 | 6/2002 | Fujii | |
| 2002/0113545 A1 | 8/2002 | Adachi | |
| 2002/0182441 A1 | 12/2002 | Lamansky | |
| 2002/0190250 A1 | 12/2002 | Grushin | |
| 2003/0072964 A1 | 4/2003 | Kwong | |
| 2003/0230980 A1 | 12/2003 | Forrest | |
| 2004/0174116 A1 | 9/2004 | Lu | |
| 2004/0197601 A1 | 10/2004 | Thompson | |
| 2004/0202893 A1 | 10/2004 | Abe | |
| 2004/0219390 A1 | 11/2004 | Potrawa | |
| 2004/0241495 A1 | 12/2004 | Kwong | |
| 2006/0088728 A1* | 4/2006 | Kwong | H05B 33/14 257/E51.026 |
| 2013/0026452 A1 | 1/2013 | Kottas | |
| 2013/0119354 A1 | 5/2013 | Ma | |

FOREIGN PATENT DOCUMENTS

| | | |
|---|---|---|
| JP | 2010135467 A | 6/2010 |
| WO | 02074015 A2 | 9/2002 |
| WO | 2004111066 A1 | 12/2004 |
| WO | 2008044723 A1 | 4/2008 |
| WO | 2008057394 A1 | 5/2008 |
| WO | 2010011390 A2 | 1/2010 |
| WO | 2010111175 A1 | 9/2010 |

OTHER PUBLICATIONS

Adachi et al., "Efficient Electrophosphorescence Using a Doped Ambipolar Conductive molecular Organic Thin Film," Organic Electronics, vol. 2, 37-43 (2001).

Adachi et al., "Nearly 100% Internal Phosphorescence Efficiency in an Organic Light Emitting Device," J. Appl. Phys., vol. 90, No. 10, 5048-5051 (2001).

Andrade et al., "High-Efficiency Yellow Double-Doped Organic Light-Emitting Devices Based on Phosphor-Sensitized Fluorescence," Appl. Phys. Lett. vol. 79, No. 7, p. 1045-1047 (2001).

Baldo et al.Highly efficient phosphorescent emission from organic electroluminescent devices, Nature, vol. 395, pp. 151-154, 1998.

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

"Inorganic Chemistry" (2nd Edition) by Gary L. Miessler and Donald A. Tarr, Prentice Hall, p. 1-3, 422-424, 442, Aug. 1998 version.

Kwong et al., U.S. Appl. No. 10/971,844, filed Oct. 2, 2004, entitled "Arylcarbazoles as Hosts in PhOLEDs".

Kwong et al., "High Operational Stability of Electrophosphorescent Devices," Appl. Phys. Lett., vol. 81, No. 1, 162-164 (2002).

Shtein et al., U.S. Appl. No. 10/233,470, filed Sep. 4, 2002, entitled "Process and Apparatus for Organic Vapor Jet Deposition".

Tsuji et al., "Red-Phosphorescent OLEDs Employing Bis(8-Quinolinolato)-Phenolato-Aluminum(III) Complexes as Emission-Layer Hosts," SID 04 Digest, 23.3, 900-903 (2004).

Adamovich et al., "New Charge-Carrier Blocking Materials for High Efficiency OLEDs," Organic Electronics, 4(2/3): 77-87, 2003.

Watanabe et al., "Optimization of driving lifetime durability in organic LED devices usingIr complex," Proceedings ofSPIE vol. 4105 (2001) 175-182.

Watanabe et al., "Optimization of emitting efficiency in organic LED cells using Ir complex," Synthetic Metals 122 (2001)203-207.

\* cited by examiner

NON-BLOCKED PHOSPHORESCENT OLEDS

The claimed invention was made by, on behalf of, and/or in connection with one or more of the following parties to a joint university corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to OLEDs which may omit hole- and/or exciton-blocking layers.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, doping percentages are quoted by weight percent.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference for the materials and configurations disclosed therein.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode may also be used, such as disclosed in U.S. Pat. Nos. 5,703,436 and 5,707,745, which are incorporated by reference for their disclosure related to transparent electrodes. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an 1P having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

DETAILED DESCRIPTION

Figure 1:
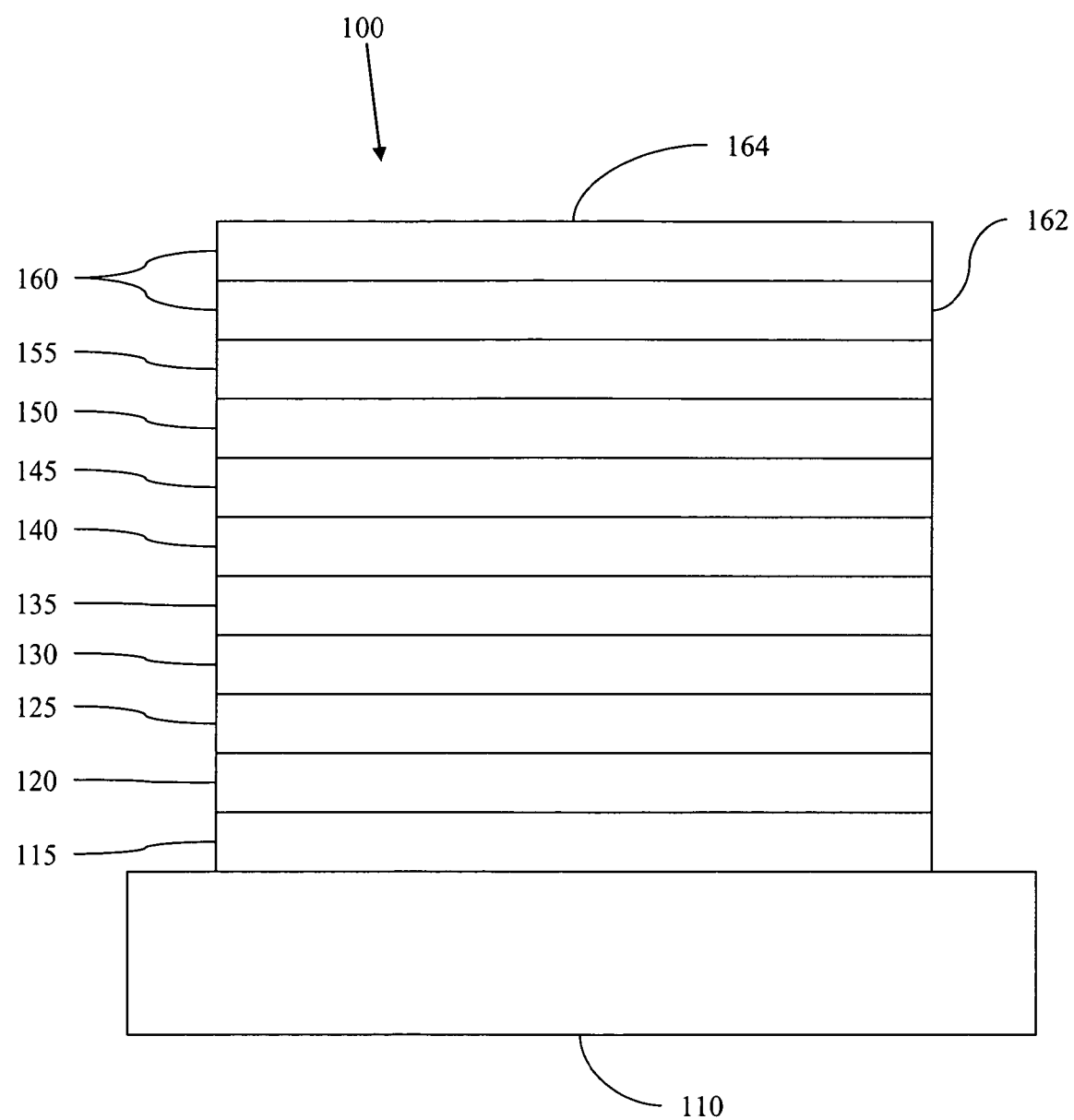
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference for its explanation of OLEDs with light emission from singlet states. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference for their explanation of OLEDs with light emission from triplet states. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference for its explanation of the exciton formation process. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference for the structures and materials used to emit from triplet excited states.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic moiety in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

FIG. 1 shows an example organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference for their disclosure regarding flexible and transparent substrate-anode combinations. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2002-0071963 A1 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include Ir(ppy)$_3$. Examples of fluorescent emissive materials include DCM and DMQA. Examples of host materials include Alq$_3$, CBP and mCP. Examples of emissive and host materials are disclosed in U.S. Pat. No. 6,303,238 to Thompson et al., which is incorporated by reference for its disclosure regarding emissive and host materials. Emissive material may be included in emissive layer 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2002-0071963 A1 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally: characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, are incorporated by reference for their disclosure of cathodes including compound cathodes having a thin layer of metal (such as Mg:Ag) with an overlying transparent, electrically-conductive layer (such as a sputter-deposited ITO layer). The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2002-0071963 A1 to Forrest et al., which are incorporated by reference for their disclosure regarding the theory and use of blocking layers.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV lower than the IP of the anode material. More preferably, the charge carrying component has an IP not more than about 0.5 eV lower than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

Organometallic complexes as hole injection materials are herein demonstrated to be useful alternatives to those commonly used such as metal phthalocyanines and arylamines. Ir(ppy)$_3$ type complexes such as Ir(3'-Meppy)$_3$ are shown as examples. Other complexes such as and Ir(5-Phppy)$_3$ and Ir(1-phenylisoquinoline)$_3$ can also be used. A wide range of Ir organometallic complexes such as Ir(2-phenylimidazole)$_3$, Ir(2-phenylbenzimidazole)$_3$, Ir(N-alkyl-N'-arylimidazole)$_3$ may be used because of the facile and reversible oxidation of the Ir(III) metal center. Further representative examples include organometallic complexes having substituted or unsubstituted ligands such as phenylpyridines, phenylimidazoles, and phenylquinolines or substituted or unsubstituted carbene ligands. Organometallic complexes with other metal such as Co(III), Fe(II), Ru(II), Os(II), etc may also be used. In organometallic complexes, the oxidation potential can be tuned by the choice of metals and the electron donating/withdrawing nature of the ligands. Other physical properties such as sublimation temperature, glass transition temperature, solubility, etc, can also be tuned by the chemical modification of the ligands.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference for the description of protective layers.

Figure 2:
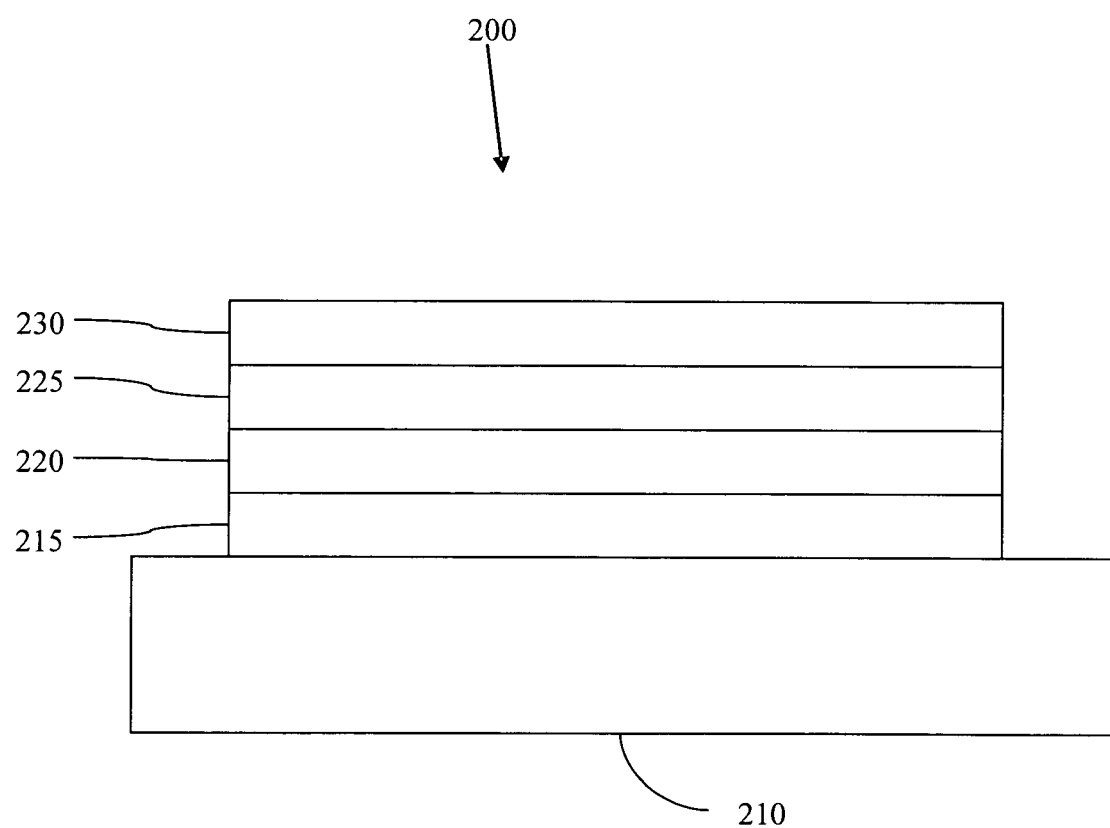
FIG. 2 shows an inverted organic light emitting device that does not have a separate electron transport layer.

FIG. 2 shows an example inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

Figure 3:
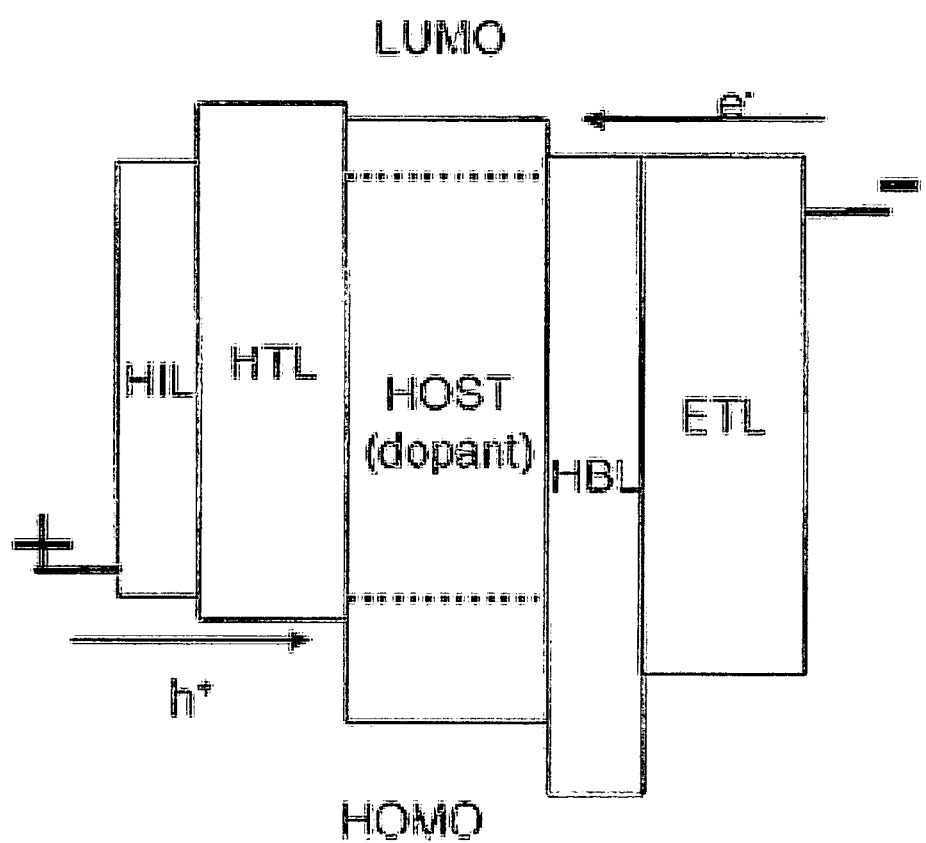
FIG. 3 shows an example energy band diagram for an OLED with a blocking layer.

Previously, blocking layer utilization in phosphorescent OLED architectures was considered important to avoid exciton and hole leakage from the emissive layer, and thus keep the recombination zone inside the emissive layer to provide high device efficiency and a pure emission spectrum. FIG. 3 shows an example energy band diagram for an OLED with a blocking layer. The ability to achieve efficient light generation while omitting the blocking layer would reduce manufacturing costs. However, light generation with high efficiency and lifetime has generally not been achieved without the inclusion of a blocking layer, particularly for wavelengths corresponding to green and shorter.

An example phosphorescent OLED structure consists of anode/hole injection layer/hole transport layer/Host:Dopant/second electron transport layer/first electron transport layer/cathode. Alq$_3$ is most commonly used as the first electron transport layer (ETL1) because of its good electron transport properties and stability. The second electron transport layer (ETL2) may be used to facilitate injecting electrons into the emissive layer (EML) and blocking holes from the EML to achieve good efficiency. This may be particularly important in non-red phosphorescent OLEDs because in non-red phosphorescent OLEDs, the hosts must have an energy gap that is not too low which implies HOMO and/or LUMO are not as easily accessible as in the case for red phosphorescent OLEDs in which lower gap hosts can be used. For example, a typical green phosphorescent OLED structure is anode/CuPc/α-NPD/CBP:Ir(ppy)$_3$/ETL2/Alq$_3$/cathode where ETL1 is BCP or BAlq. See Baldo et al, Appl. Phys. Lett. 75 (1999) 4 and Kwong et al, Appl. Phys. Lett. 81 (2002) 162. Skipping the ETL2 layer, i.e. anode/CuPc/α-NPD/CBP:Ir(ppy)$_3$/Alq$_3$/cathode, generates less than half the efficiency of the those with BCP or BAlq as the ETL2.

Figure 4:
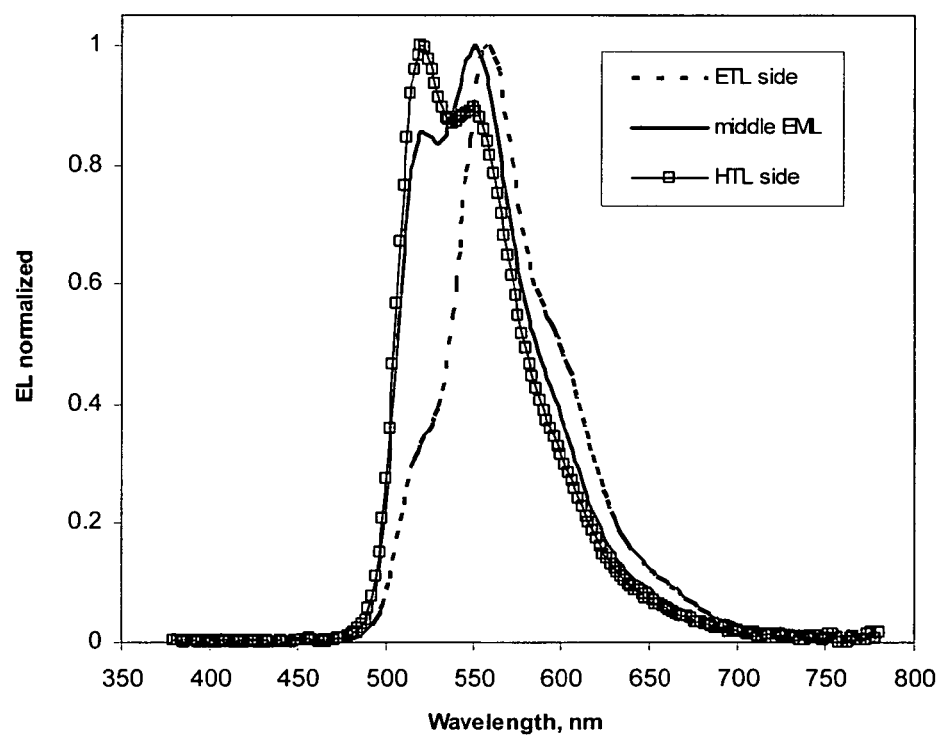
FIG. 4 shows the normalized electroluminescent spectra of an Ir(5-Phppy)$_3$ (12%) phosphorescent OLED with 2 nm 0.5% rubrene probes inserted into the emissive layer close to the hole transport layer, in the middle of the emissive layer, and close to the electron transport layer.

This is believed to be due to the unbalanced hole and electron transport in the EML because both CBP and Ir(ppy)$_3$ are more hole transporting than electron transporting. Moreover, Alq$_3$ does not inject electrons well into CBP and mCP, presumably due to the electron injection barrier and the dipole moment of Alq$_3$ (reference low dipole application). As a result, during operation, it is believed that holes migrate faster towards the ETL side faster than electrons migrate to the HTL side. To achieve good efficiency in this unbalanced device, BCP is used as an ETL2 because it has a deep HOMO level (−5.87 eV) which effectively blocks holes from migrating into the ETL1 or BAlq is used as the ETL2 because it can inject electrons well into the EML and has better blocking properties than Alq$_3$. FIG. 4 illustrates this point.

The device structure is ITO/CuPc (10 nm)/α-NPD (30 nm)/CBP:Ir(5-Phppy)$_3$ (30 nm and 12%)/2,3,6,7,10,11-hexphenyltriphenylene (5 nm)/Alq$_3$ (45 nm)/LiF/Al where 2,3,6,7,10,11-hexphenyltriphenylene has a deep HOMO of −5.54 eV and a triplet energy of 2.6 eV which therefore facilitates blocking at the EML/ETL2 interface. The molecule 2,3,6,7,10,11-hexphenyltriphenylene is:

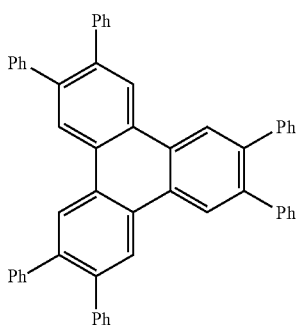 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1]

FIG. 4 shows the EL spectrum of this device and 2 similar devices where 2 nm of 0.5% rubrene have been co-doped into the EML along with CBP and Ir(5-Phppy)$_3$ at 3 respective places:
1. the HTL/EML interface i.e. ITO/CuPc (10 nm)/α-NPD (30 nm)/CBP: Ir(5-Phppy)$_3$ (12%): Rubrene (0.5%)(2 nm)/CBP: Ir(5-Phppy)$_3$ (28 nm and 12%)/HPT (5 nm)/Alq$_3$ (45 nm)/LiF/Al
2. in the middle of the EML i.e. ITO/CuPc (10 nm)/α-NPD (30 nm)/CBP: Ir(5-Phppy)$_3$ (14 nm and 12%)/CBP: Ir(5-Phppy)$_3$ (12%): Rubrene (0.5%)(2 nm)/CBP: Ir(5-Phppy)$_3$ (14 nm and 12%)/HPT (5 nm)/Alq$_3$ (45 nm)/LiF/Al
3. at the EML/ETL interface i.e. ITO/CuPc (10 nm)/α-NPD (30 nm)/CBP: Ir(5-Phppy)$_3$ (28 nm and 12%)/CBP: Ir(5-Phppy)$_3$ (12%): Rubrene (0.5%)(2 nm)/HPT (5 nm)/Alq$_3$ (45 nm)/LiF/Al Ir(5-Phppy)$_3$ is a green phosphorescent dopant with a peak emission intensity at 518-520 nm. Rubrene has a characteristic yellow/orange color with a peak emission intensity at 558 nm. When rubrene is co-doped in small amounts into the green phosphorescent OLED it can emit via phosphorescent sensitized fluorescence (B. D'Andrade et al. *Appl. Phys. Lett.* (2001) 79-7, p. 1045) if there are green excitons sufficiently close enough to the rubrene that can transfer their energy to the rubrene dopant. The location of the rubrene 'probe' layer therefore acts as an indicator of the amount of exciton recombination at a particular place within the EML. FIG. 4 shows that the majority of the exciton recombination in the CBP: Ir(5-Phppy)$_3$/HPT device occurs at the EML/ETL2 interface.

The probe method used herein enables a determination to be made about where recombination occurs in the phosphorescent OLED. By way of example, a first OLED is procured which includes an emissive layer, the emissive layer comprising a host material and a first phosphorescent dopant material. The phosphorescent dopant material emits light having a first spectra when electric current is applied to the OLED. A test OLED is formed having a structure substantially identical to that of the first OLED, and further includes a test dopant in a first region of the emissive layer. A "substantially identical" structure allows for normal manufacturing variation. Excitons preferentially transfer from the emissive material to the test dopant, and the test dopant has an emissive spectra different from that of the emissive material. By measuring and comparing the light output of the first OLED and the test OLED, when the first OLED and the test OLED are operated under similar conditions, a determination is made as to whether the test dopant is at a region of the test OLED from which the emissive material would emit light if the test dopant were not present. "Operated under similar conditions" means similar current and/or voltage. The measuring and comparing is preferably a comparison of the spectra of the two devices, but could include measurements such as luminous output or peak wavelength.

While the examples herein use rubrene, the method is not so limited. Preferably, the test dopant is a fluorescent material, although it could instead be a second phosphorescent material. Preferably, the test dopant works by phosphorescent sensitized fluorescence, and the test dopant preferably does not affect or interfere with device operation, other than changing the electroluminescent spectrum. The test dopant may have an emission spectra that is lower in energy than that of the first phosphorescent dopant material. Preferably, a density of the test dopant in the localized area is between 0.5% and 0.01%. A test dopant that does not emit would be considered to have an emissive spectra "different" from that of the emissive material.

The testing method can be expanded to form a plurality of test OLEDs, each test OLED having a structure substantially similar to the first OLED, and each test OLED including the test dopant disposed in a different region of the emissive layer. The light output from each of the plurality of test OLEDs is measured and compared to the light output of the first OLED to determine from which region of the first OLED light is being emitted.

Figure 5:
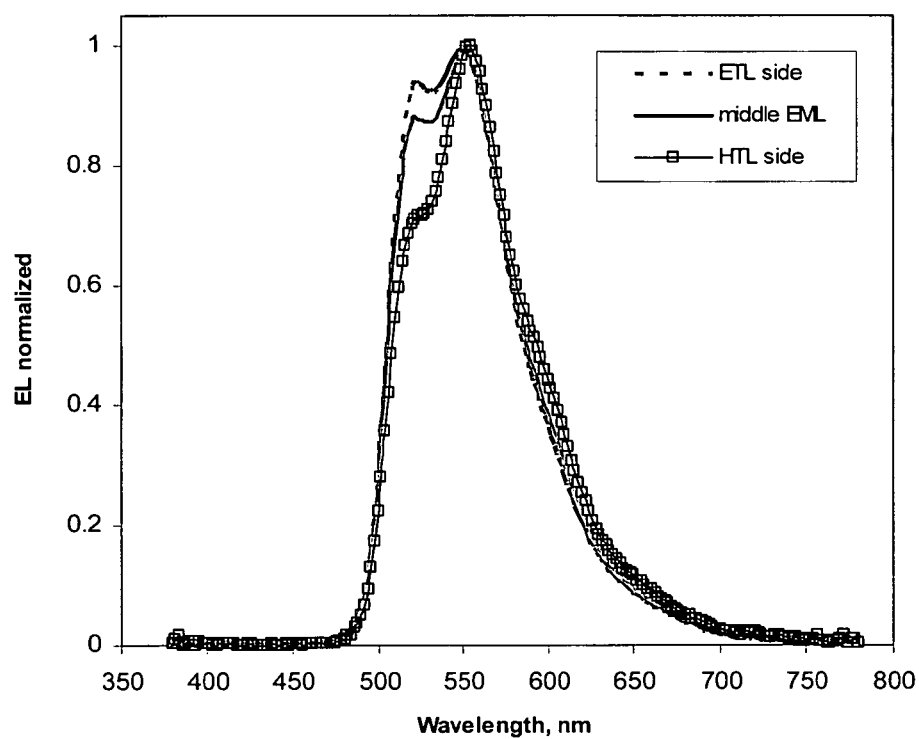
FIG. 5 shows the normalized electroluminescent spectra of an Ir(3'-Meppy)$_3$ (6%) phosphorescent OLED with 2 nm 0.5% rubrene probes inserted into the emissive layer close to the hole transport layer, in the middle of the emissive layer, and close to the electron transport layer.

FIG. 5 shows the electroluminescent spectrum of the same device structure with rubrene fluorescent probes inserted, as in FIG. 4. The only difference is the green phosphorescent dopant is 6% Ir(3'-Meppy)$_3$ instead of 12% Ir(5-Phppy)$_3$. In case of Ir(3'-Meppy)$_3$ dopant the majority of recombination in the EML occurs next to HTL interface (the intensity of the rubrene peak is the highest when the probe is inserted next to HTL).

This means that Ir(3'-Meppy)$_3$ dopant is less hole transporting and more electron transporting than Ir(5-Phppy)$_3$ (compare HOMO and LUMO levels of Ir(5-Phppy)$_3$ versus Ir(3'-Meppy)$_3$; they have the same HOMO, but Ir(3'-Meppy)$_3$ has a 0.3 eV higher LUMO. We believe this shows that the HOMO/LUMO levels do not correlate to charge mobility that much. Rather, the levels correlate more to the barrier to charge injection). For a non-blocked architecture the location of recombination zone is critical. The further away the recombination occurs from ETL interface, the less sensitive should be the device efficiency to the blocking layer (ETL2) layer.

Low dipole materials such as Zrq$_4$ and Hfq$_4$ may inject electrons well into the EML. For its explanation of low dipole materials and for additional low dipole materials that may be used, U.S. Published Application 20040197601 A1, published Oct. 7, 2004, is incorporated herein by reference. To simplify the device structure hence reducing manufacturing cost, it is preferred to eliminate the use of two ETLs and only use a single ETL e.g. Alq$_3$ directly on top of the EML. α-NPD/Host:Ir(ppy)$_3$/Alq$_3$ may have good efficiencies. See Adachi et al., "Architectures For Efficient Electrophosphorescent Organic Light-Emitting Devices," IEEE J. on Selected Topics in Quantum Elec., 8, 372-377 (2002); and Adachi et al., "Nearly 100% Internal Phosphorescent Efficiency In An Organic Light Emitting Device," J. Appl. Phys., 90, 5048 (2001). In these cases, the mechanism is believed to be the hosts such as BCP (HOMO=−5.87 eV, HOMO ΔE=1.16 eV with respect to α-NPD) with deep HOMO severely limit the injection and migration of holes. These devices also show poor stability and are therefore not practical in commercial applications. For example in T. Watanabe, K. Nakamura, S. Kawami, Y. Fukuda, T. Tsuji, T. Wakimoto, S. Miyaguchi, Proceedings of SPIE 4105 (2000)

175 and T. Watanabe, K. Nakamura, S. Kawami, Y. Fukuda, T. Tsuji, T. Wakimoto, S. Miyaguchi, M. Yahiro, N.-J. Yang, T. Tsutsui, Synthetic Metals 1221 (2001) 203, the instability of BCP containing devices is demonstrated, with the cause suspected to be electrochemical and morphological instabilities.

Based on our research on recombination with the rubrene fluorescent probes, we developed an organic light emitting diode (OLED) architecture in which efficient operation is achieved, in some examples, in wavelengths corresponding to green without requiring a blocking layer by locating the recombination zone close to the hole transport side of the emissive layer. The concepts are applicable to all wavelengths. The choice of host and phosphorescent dopant materials can effect the location of the recombination zone within the emissive layer of the device. Based on the hole or electron transporting ability of the material due to HOMO-LUMO energy levels position and/or hole or electron mobility, we were able to find host and phosphorescent dopant combinations which allowed building of devices with recombination zones shifted to the hole transport layer side of the emissive layer, thereby providing an efficient structure without a blocking layer. This simplifies device structure by eliminating the blocking layer.

As an embodiment of the present invention, a device structure is designed such that the hosts can accept electrons readily from the electron transport layer such as $Alq_3$, offering efficient operation with no requirement for an additional electron transport layer to facilitate hole blocking or electron injection. The LUMO level of such hosts is designed to be lower than those of commonly used hosts such as CBP or mCP, while retaining effective hole injection from the HTL and hole migration in the EML to achieve good hole-electron balance, and high triplet energy levels. As is understood in the art, the π-conjugation of aromatic systems may be increased by extending the n-conjugation by fusing aryl rings (for example, using napthalene or phenanthrene versus benzene or biphenyl) or extending the double/triple bonds by e.g. ortho or para substitutions (for example, using stilbene versus biphenyl). The degree of it-conjugation affects the HOMO and LUMO properties of compounds. Generally, increasing the degree of it-conjugation also decreases the band gap by raising the HOMO level and/or lowering the LUMO level which are both desirable from the perspective of charge injection and migration. Embodiments of the invention are believed to possess sufficiently high triplet energy levels for use in non-red OLEDs. It is also believed that the oxidized (cation radical) and reduced (anion radical) states of organic materials with high degree of π-conjugation have higher stability than the less conjugated ones. This may be because in the charged state the hole or electron can delocalize more extensively.

Figure 6:
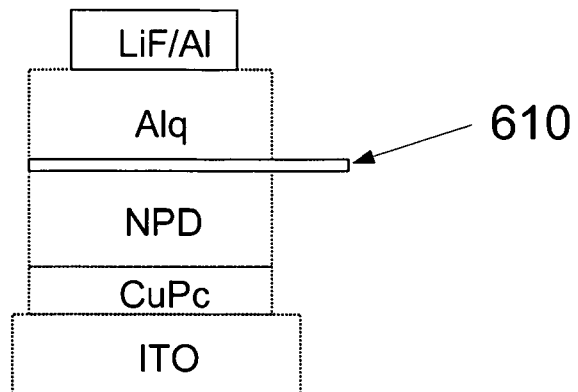
FIG. 6 shows an OLED structure used to compare the electron transporting properties of 2,7-DCP and CBP, with a layer of 2,7-DCP or CBP placed between an Alq$_3$ electron transport layer and a NPD hole transport layer.
Figure 7:
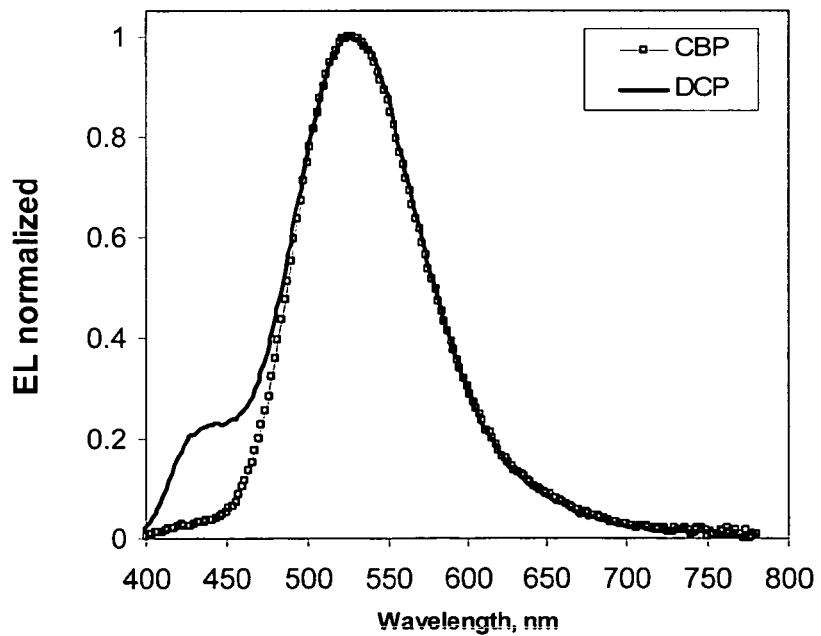
FIG. 7 shows the normalized EL spectra of the devices of FIG. 6.

FIGS. 6 through 10 show that the new 2,7-DCP host material, designed with above properties, has superior electron transporting properties to those of CBP. As evidence, FIG. 7 shows EL spectra of CuPc (100 Å)/NPD (400 Å)/X/$Alq_3$ (500 Å)/LiF/Al device with X equal to a 100 Å of CBP or 2,7-DCP layer (FIG. 6, layer 610) at the interface between NPD and $Alq_3$, as shown in FIG. 6. With 2,7-DCP layer we can see some NPD emission in the spectrum, whereas with CBP the emission is solely from $Alq_3$ ($Alq_3$ has a peak emission wavelength of ~520 nm and NPD has a peak emission wavelength of ~430 nm). It indicates that DCP possess better electron transporting and hole blocking properties than CBP (i.e., can transport electrons to NPD layer for recombination there and block some holes from getting to $Alq_3$ and recombining there).

Figure 8:
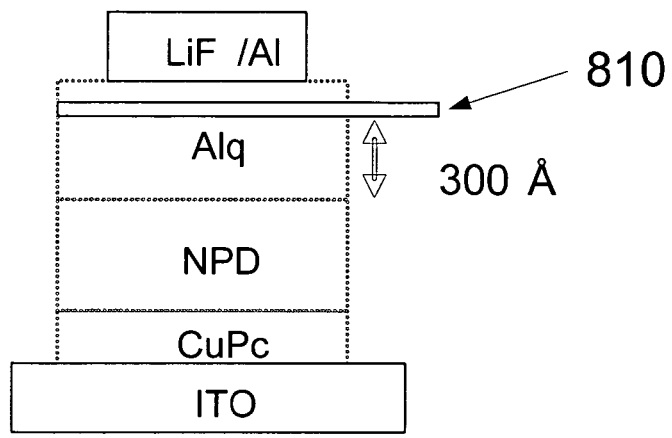
FIG. 8 shows a structure similar to that in FIG. 6 used to compare the electron transporting properties of 2,7-DCP and CBP, but in which the layer of 2,7-DCP or CBP is inserted into the Alq$_3$ electron transport layer.
Figure 9:
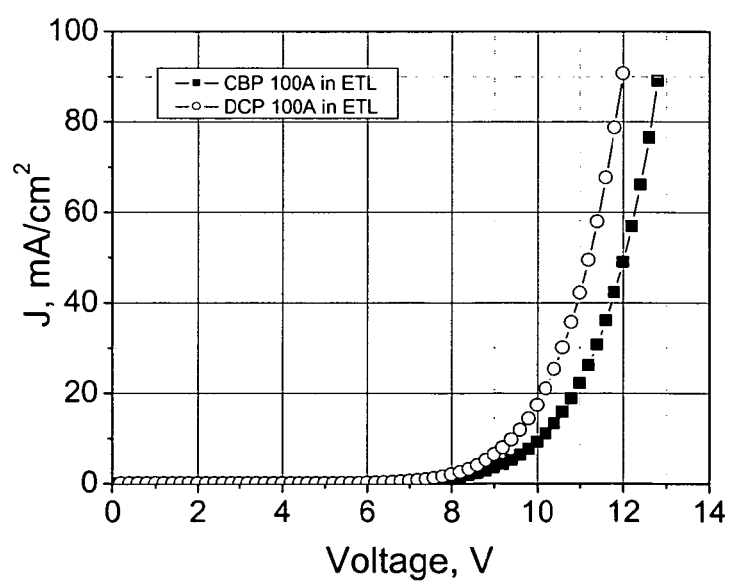
FIG. 9 shows the current density versus operating voltage for the devices of FIG. 8.
Figure 10:
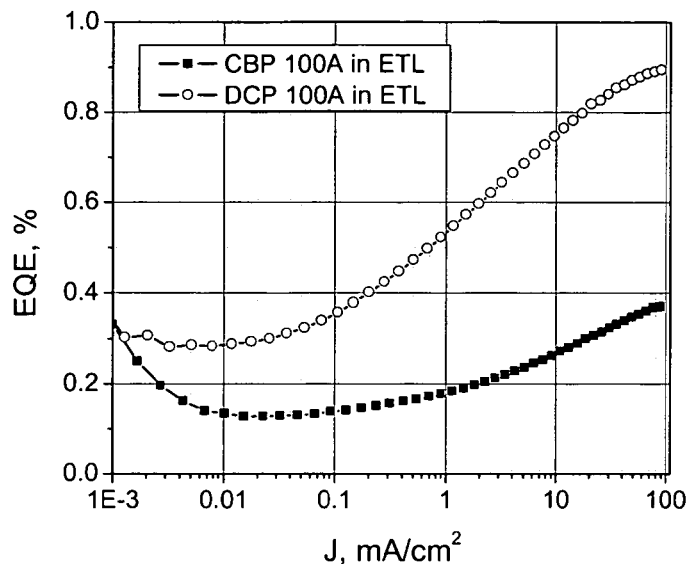
FIG. 10 shows the external quantum efficiency versus current density of the devices in FIG. 8.

FIG. 9 shows the current density versus voltage and FIG. 10 shows the external quantum efficiency versus current density of a CuPc/NPD/$Alq_3$/X/$Alq_3$/LiF/Al device, where X=CBP or 2,7-DCP 100 Å layer (FIG. 8, layer 810) inserted into the $Alq_3$ ETL, as shown in FIG. 8. The 2,7-DCP layer device has lower voltage and significantly higher efficiency than the device with CBP layer in ETL. It supports the statement that 2,7-DCP is a better electron transporting material than CBP.

External quantum efficiency as used herein refers to photons out per electrons in for devices that have approximately 20 to 30% outcoupling.

Other example host materials such as those included below in Table 1 may be used to achieve similar results. Preferably, the host is a fused-aryl ring. Specific examples of a fused-aryl ring include a carbazole or a dicarbazole. Additional examples of carbazoles may be found in U.S. application Ser. No. 10/971,844 entitled "Arylcarbazoles As Hosts In PhOLEDs" filed Oct. 22, 2004, the examples from which are incorporated herein by reference. Preferably, the host is combined with an organic dopant having a triplet energy corresponding to a peak emission wavelength of less than 600 nm. For example, the dopant may be selected from phosphorescent materials such as Ir(5-Phppy)$_3$ or Ir(3'-Meppy)$_3$.

Further refinement to position the triplet recombination zone at the interface of the emissive layer with the hole transport layer may be experimentally achieved by adjusting layer thicknesses, materials, and host/dopant ratios, using for example the probe method referred to above. By adjusting values and forming test devices including a probe layer, the position of recombination may be determined. Once a desired position is achieved, devices can be produced using these values, but omitting the probe layer. As used herein the recombination zone "at the interface of the emissive layer with the HTL" means in the emissive layer, but with peak recombination positioned not more than 10% of the thickness of the emissive layer away from the interface.

Figure 11:
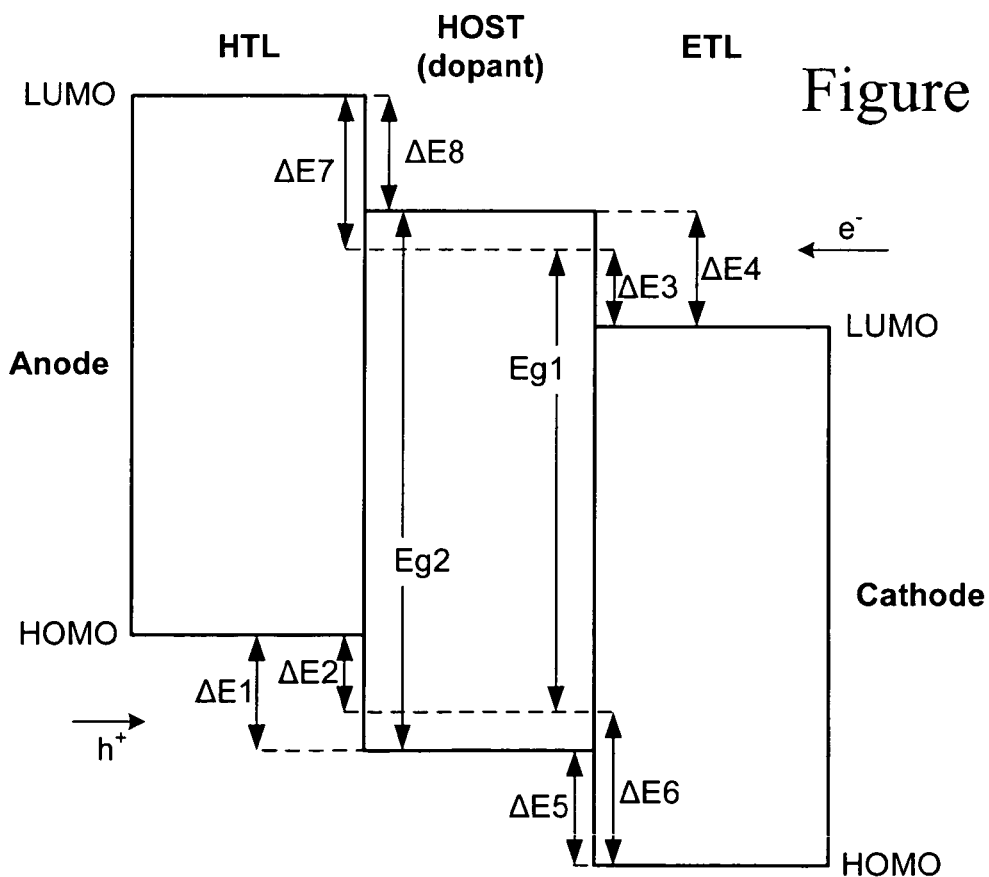
FIG. 11 is a schematic energy level diagram of a phosphorescent OLED without blocking layers.

A schematic energy level diagram of a phosphorescent OLED without blocking layers is illustrated in FIG. 11. For each individual layer, the HOMO level of the layer material is responsible for hole transport through the layer and the LUMO level is responsible for electron transport through this layer. Tor the emissive layer consisting of host and dopant components, HOMO and LUMO levels of both the host and dopant can transport charge through the layer. The relative position of host and dopant HOMO and LUMO levels defines which component transports holes and electrons through the emissive layer.

As described above, typically a blocking layer is required between the emissive layer and ETL to confine the excitons and charges within the emissive layer and prevent holes and exciton leakage to the ETL, in order to maintain a high device efficiency and a pure emission spectrum. Due to higher hole mobility as compared to electron mobility, the blocking layer is much more important on the ETL side rather than the HTL side of the emissive layer. However, if the recombination zone is located close to the HTL side of the emissive layer (away from the ETL interface) the blocking layer on the ETL side may not be necessary, since the majority of excitons are formed at the emissive layer-HTL interface. The ability of host (or dopant) to transport electrons rather than holes can shift the recombination zone away from the ETL interface, and then may allow no blocking layer phosphorescent OLED structures with high efficiency.

Based on our experimental results and referring to FIG. 11, we conclude that an efficient device can be realized by selecting a combination of hole transport material, host material, and electron transport material resulting in a $\Delta E_1 \leq 0.8$ eV, $\Delta E_4 \leq 0.4$ eV, and $\Delta E_5 \leq 0.4$ eV. As a further embodiment, $\Delta E_1/\Delta E_4 < 2.0$ in order to balance carrier transport characteristics of the carrier types. The organic dopant is preferably a phosphorescent material, having a triplet energy corresponding to a peak emission wavelength of less than 600 nm. Example dopants include Ir(5-Phppy)$_3$ and Ir(3'-Meppy)$_3$. These characteristics produce an efficient device. Further refinement to position the triplet recombination zone at the interface of the emissive layer with the hole transport layer may be experimentally achieved by adjusting layer thicknesses, materials, and host/dopant ratios, using for example the probe method described above.

Density functional calculations (DFT) of HOMO and LUMO levels are preferred over literature calculations due to consistency from iteration to iteration, whereas literature values can show significant energy level variations for the same energy level of a same material based upon the equipment used to measure the value. As computed herein, all HOMO-LUMO density functional calculations were performed using the Spartan 02 software package, available from Wavefunction Inc. of Irvine, Calif., at the B3LYP/6-31G* level with the exception of DTBD, which was performed at the B3LYP/6-31G(d) level, and Ir(F$_2$CNppy)$_2$(pic), which was performed at the B3LYP/CEP-31g level, both using the Gaussian98 software package.

The wavelengths of light to be emitted from the emissive layer is a material characteristic that depends upon the triplet energies, which are characteristics of the materials selected for the emissive layer. The correlation between the actual triplet energy (actual; not density functional calculations) and wavelength can be determined as follows:

$$E_{Triplet} = \left(\frac{6.626 \times 10^{-34} \text{ J}}{\text{s}}\right)\left(\frac{1 \text{ eV}}{1.602 \times 10^{-19} \text{ J}}\right)\left(\frac{2.998 \times 10^8 \text{ m}}{\text{s}}\right)\left(\frac{1}{\lambda}\right)$$

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:

CBP: 4,4'-N,N-dicarbazole-biphenyl
m-MTDATA 4,4',4''-tris(3-methylphenylphenlyamino)triphenylamine
Alq$_3$: 8-tris-hydroxyquinoline aluminum
Bphen: 4,7-diphenyl-1,10-phenanthroline
n-BPhen: n-doped BPhen (doped with lithium)
F$_4$-TCNQ: tetrafluoro-tetracyano-quinodimethane
p-MTDATA: p-doped m-MTDATA (doped with F$_4$-TCNQ)
Ir(ppy)$_3$: tris(2-phenylpyridine)-iridium
Ir(ppz)$_3$: tris(1-phenylpyrazoloto,N,C(2')iridium(III)
Ir(3'-Meppy)$_3$: iridium(III) tris(2-phenyl-3-methylpyridine)
Ir(5-Phppy)$_3$: iridium(III) tris(2-(3-biphenyl)pyridine)
BCP: 2,9-dimethyl-4,7-diphenyl-1,10-phenanthroline
2,7-DCP 2,7-N,N-dicarbazolephenanthren
2,7-DCPT: 2,7-di(4-(N-carbazole)phenyl)triphenylene
TAZ: 3-phenyl-4-(1'-naphthyl)-5-phenyl-1,2,4-triazole
CuPc: copper phthalocyanine.
ITO: indium tin oxide
HPT: 2,3,6,7,10,11-hexaphenyltriphenylene
NPD: N,N'-diphenyl-N—N'-di(1-naphthyl)-benzidine
TPD: N,N'-diphenyl-N—N'-di(3-toly)-benzidine
BAlq: aluminum(III)bis(2-methyl-8-hydroxyquinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS)

TABLE 1 illustrates example host materials and properties calculated using DFT:

|  |  | HOMO (eV) | LUMO (eV) | Dipole (debye) | LUMO-HOMO (eV) | ΔE1 (w.r.t. a-NPD) | ΔE4 (w.r.t. Alq$_3$) | ΔE5 (w.r.t. Alq$_3$) |
|---|---|---|---|---|---|---|---|---|
| CBP | 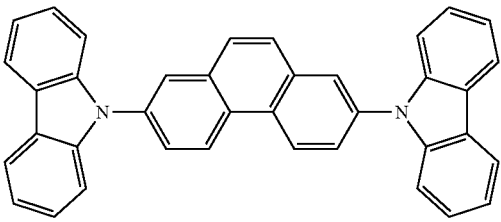 [SMILES: c1ccc2c(c1)c1ccccc1n2-c1ccc2c(ccc3cc(-n4c5ccccc5c5ccccc54)ccc32)c1] | −5.32 | −1.23 | 0 | 4.09 | 0.61 | 0.5 | −0.32 |
| 2,7-DCPT | 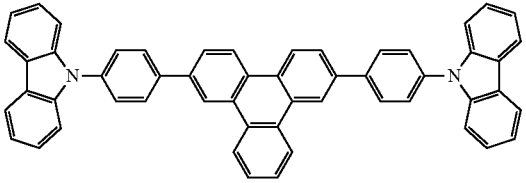 [SMILES: c1ccc2c(c1)c1cc(-c3ccc(-n4c5ccccc5c5ccccc54)cc3)ccc1c1ccc(-c3ccc(-n4c5ccccc5c5ccccc54)cc3)cc21] | −5.3 | −1.57 | 0.13 | 3.73 | 0.59 | 0.16 | −0.3 |

TABLE 1-continued illustrates example host materials and properties calculated using DFT:

| | | HOMO (eV) | LUMO (eV) | Dipole (debye) | LUMO-HOMO (eV) | ΔE1 (w.r.t. a-NPD) | ΔE4 (w.r.t. Alq₃) | ΔE5 (w.r.t. Alq₃) |
|---|---|---|---|---|---|---|---|---|
| 2,7-DCT | | −5.28 | −1.36 | 0.37 | 3.92 | 0.57 | 0.37 | −0.28 |
| 3,6-DCT | | −5.32 | −1.35 | 2.89 | 3.97 | 0.61 | 0.38 | −0.32 |
| 2,6,10-TCT | | −5.42 | −1.5 | 0.15 | 3.92 | 0.71 | 0.23 | −0.42 |
| 2,7-DCP | | −5.3 | −1.42 | 0.03 | 3.88 | 0.59 | 0.31 | −0.3 |
| 3,6-DCP | | −5.28 | −1.44 | 2.57 | 3.84 | 0.57 | 0.29 | −0.28 |
| 2,6-DCN | | −5.3 | −1.52 | 0 | 3.78 | 0.59 | 0.21 | −0.3 |

Experimental:

All devices are fabricated in high vacuum (<10⁻⁷ Torr) by thermal evaporation. The anode electrode is ~1200 Å of indium tin oxide (ITO). The cathode consists of 10 Å of LiF followed by 1,000 Å of Al. All devices are encapsulated with a glass lid sealed with an epoxy resin in a nitrogen glove box (<1 ppm of H$_2$O and O$_2$) immediately after fabrication, and a moisture getter was incorporated inside the package.

Specific representative embodiments of the invention will now be described and compared to prior art examples. It is understood that the specific methods, materials, conditions, process parameters, apparatus and the like do not necessarily limit the scope of the invention.

In the experimental examples, the dopant used is Ir(3'Meppy)$_3$. The Ir(3'Meppy)$_3$ molecule is:

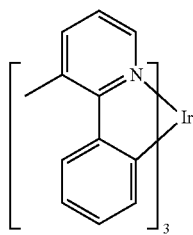

Figure 12:
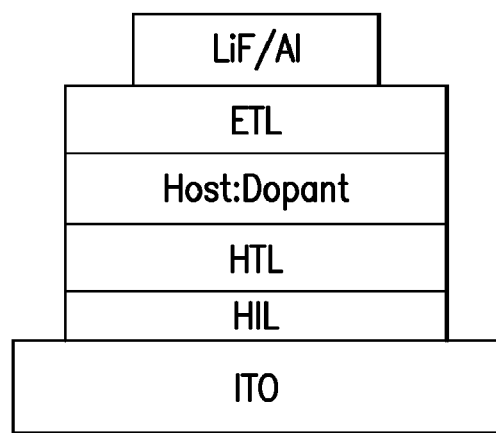
FIG. 12 is a structure without a blocking layer used to perform experimental comparisons between CBP as a host and 2,7-DCP as a host.

Comparisons were performed between CBP and 2,7-DCP hosts in a phosphorescent OLED without a blocking layer having the structure illustrated in FIG. 12. The specific test structures were ITO (1200 Å)/HIL (100 Å)/NPD (300 Å)/host:dopant (4.5% 300 Å) /Alq$_3$ (450 Å)/LiF (10 Å)/Al (1000 Å). The results are illustrated in Table 2:

|  | Example 1 | Example 2 | Example 3 | Example 4 |
|---|---|---|---|---|
| Host | DCP | DCP | CBP | CBP |
| Dopant | Ir(3'-Meppy)$_3$ | Ir(3'-Meppy)$_3$ | Ir(3'-Meppy)$_3$ | Ir(3'-Meppy)$_3$ |
| HIL | CuPc | Ir(3'-Meppy)$_3$ | CuPc | Ir(3'-Meppy)$_3$ |
| Color | green | green | green | green |
| CIE x | 0.32 | 0.33 | 0.32 | 0.33 |
| CIE y | 0.63 | 0.62 | 0.63 | 0.62 |
| External quantum efficiency at 1000 cd/m$^2$, % | 9.2 | 10.2 | 7.2 | 7.8 |
| Luminous efficiency at 1000 cd/m$^2$, cd/A | 34.1 | 37.8 | 26.7 | 28.8 |
| Driving voltage at 1000 cd/m$^2$, V | 8.2 | 6.8 | 9.2 | 8.0 |
| Power efficiency at 1000 cd/m$^2$, lm/W | 13.1 | 17.5 | 9.1 | 11.4 |
| 50% luminance drop of the device DC driven at room temperature, 40 mA/cm$^2$ | 370 hours |  | 330 hours |  |

Figure 13:
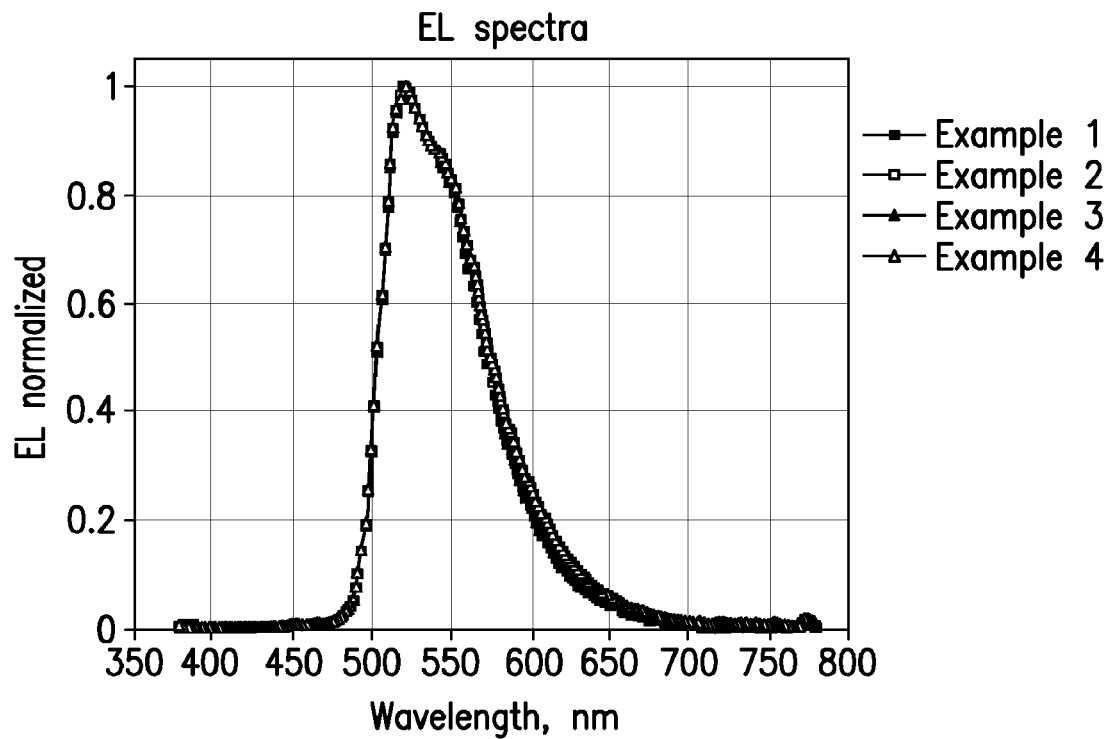
FIG. 13 illustrates the normalized electroluminescence spectra at 10 mA/cm$^2$ for the experimental comparisons demonstrated with the structure of FIG. 12.
Figure 14:
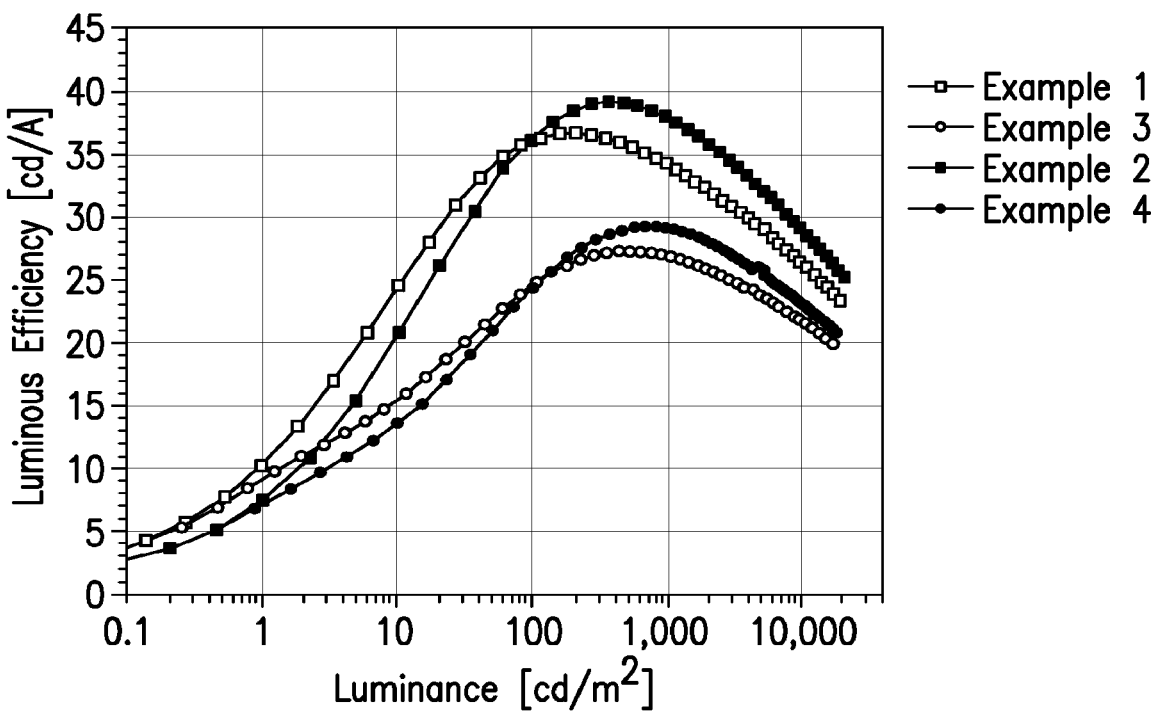
FIG. 14 illustrates the luminous efficiency versus luminance for the experimental comparisons demonstrated with the structure of FIG. 12.
Figure 15:
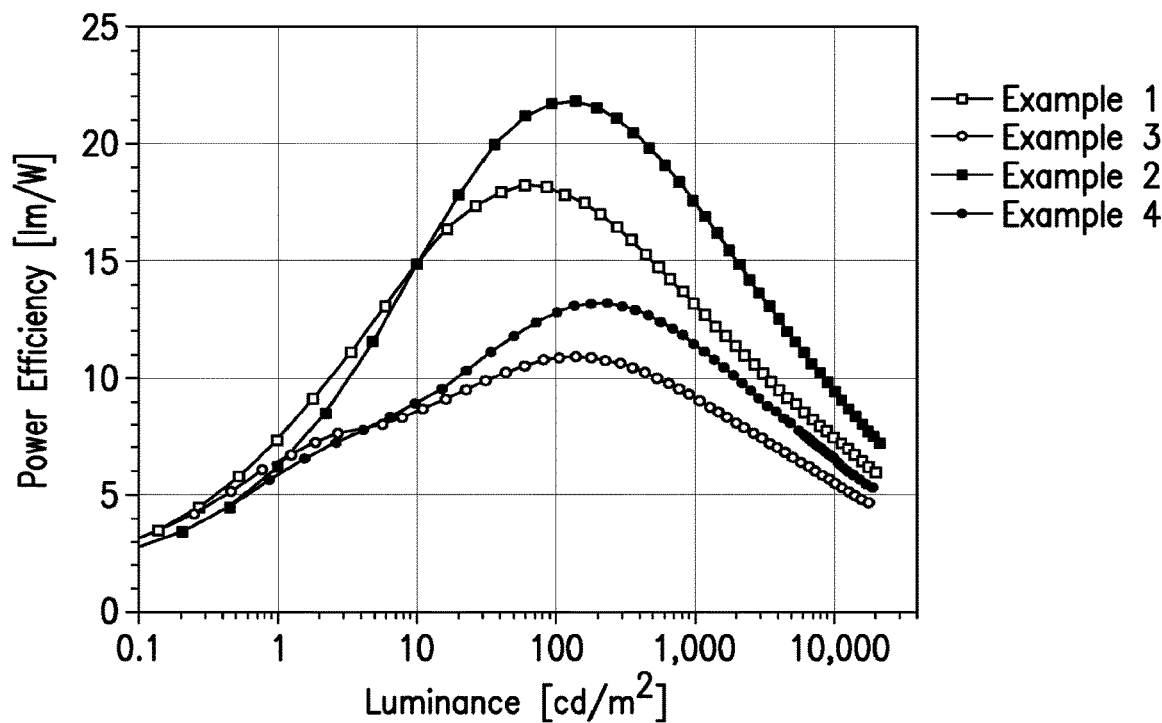
FIG. 15 illustrates the power efficiency versus the luminance for the experimental comparisons demonstrated with the structure of FIG. 12.
Figure 16:
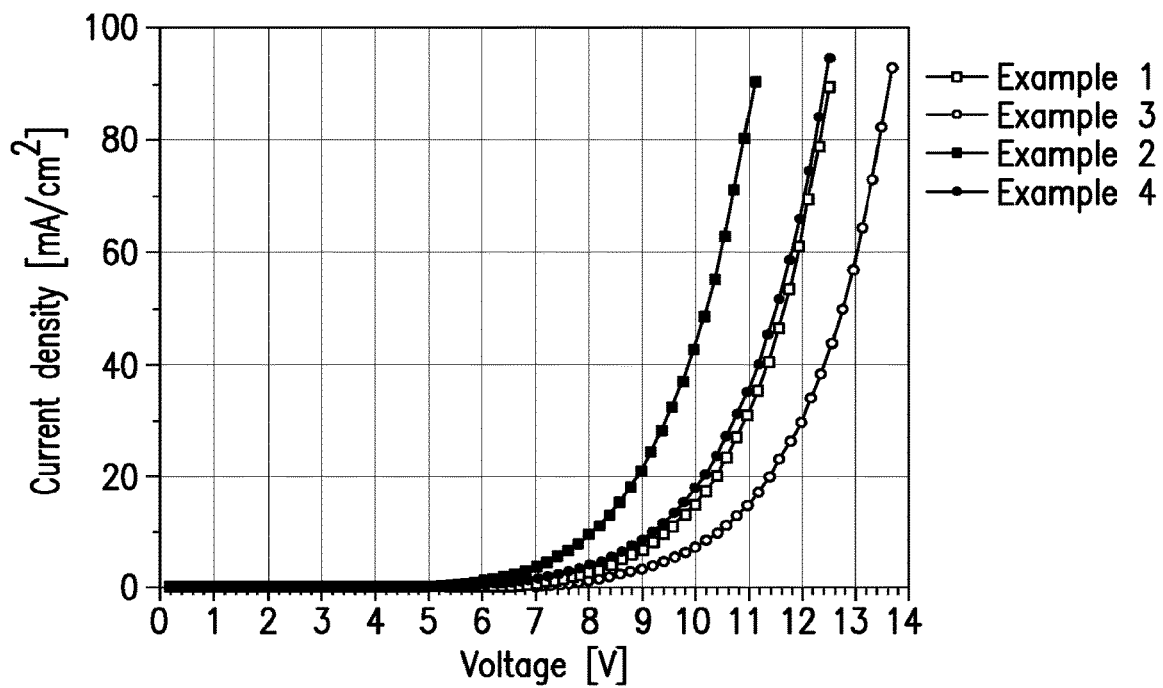
FIG. 16 illustrates the current density versus voltage for the experimental comparisons demonstrated with the structure of FIG. 12.
Figure 17:
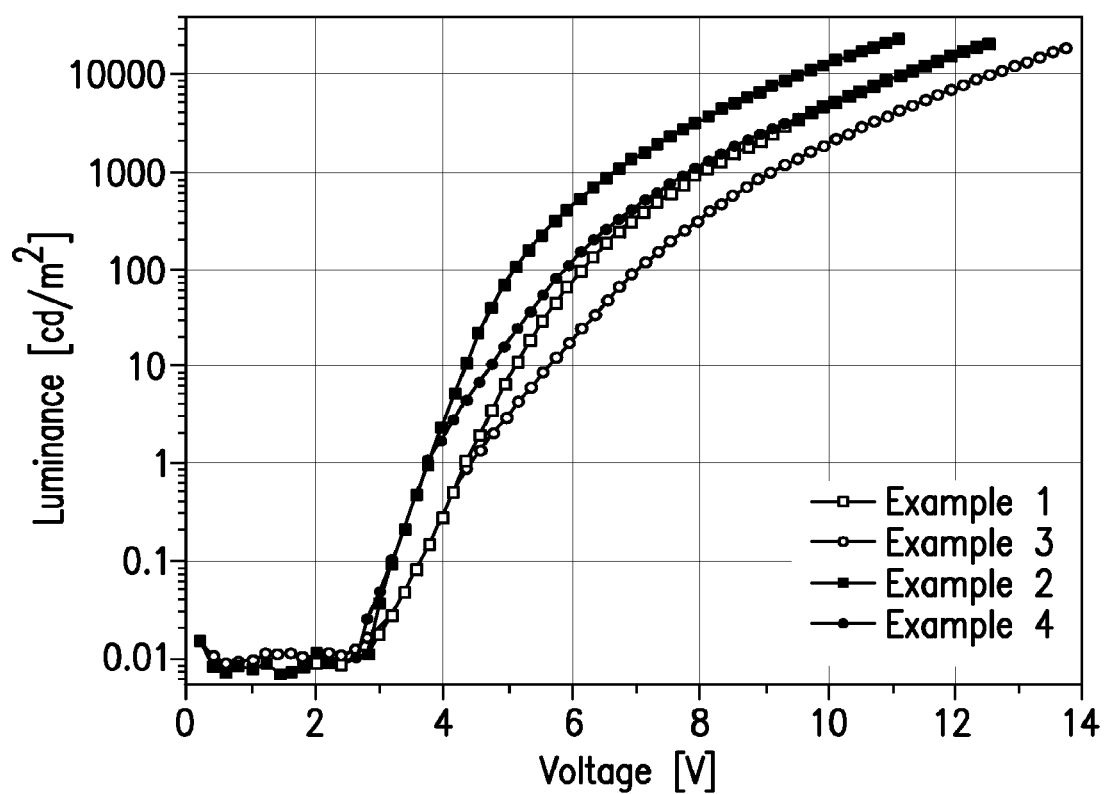
FIG. 17 illustrates the luminance versus voltage for the experimental comparisons demonstrated with the structure of FIG. 12.

Further results for the four examples are illustrated in FIGS. 13 through 17. FIG. 13 illustrates the normalized electroluminescence spectra at 10 mA/cm$^2$; FIG. 14 illustrates the luminous efficiency versus luminance; FIG. 15 illustrates the power efficiency versus the luminance; FIG. 16 illustrates the current density versus voltage; and FIG. 17 illustrates the luminance versus voltage.

Figure 18:
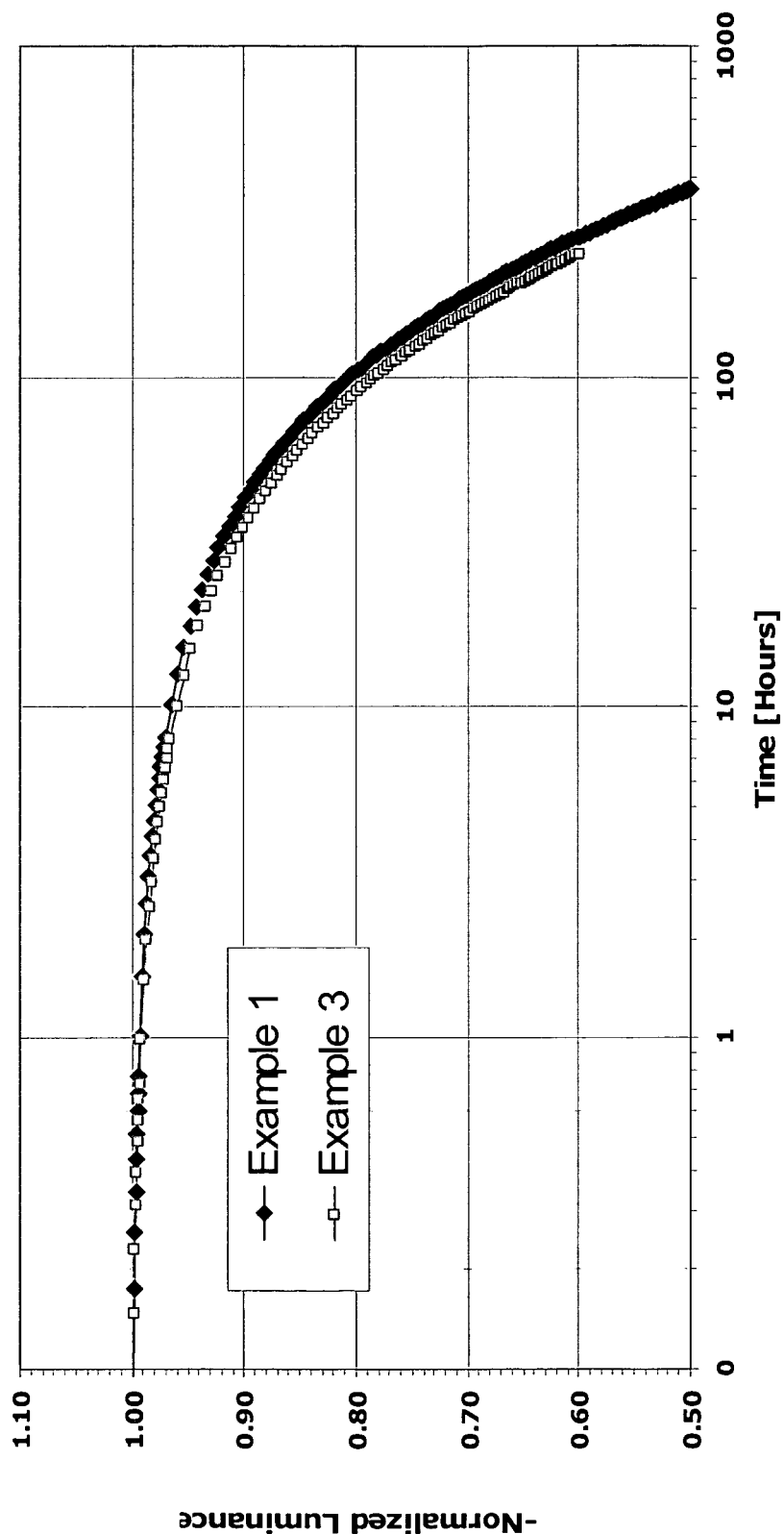
FIG. 18 shows the lifetime at room temperature with 40 mA/cm$^2$ for non-blocked green structure demonstrated in examples 1 and 3 with FIG. 12.
Figure 19:
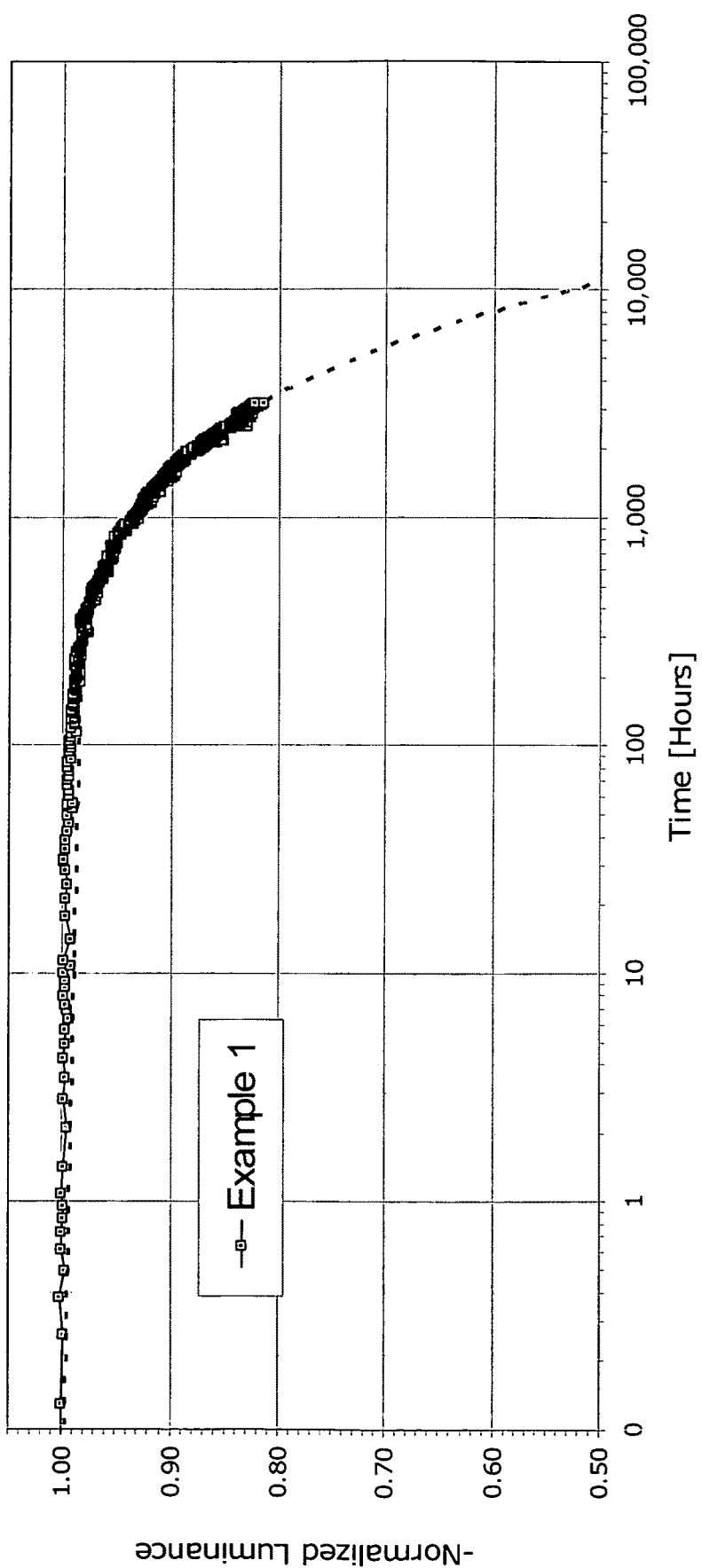
FIG. 19 shows the lifetime at room temperature with 1000 cd/m$^2$ for non-blocked green structure demonstrated in example 1 with FIG. 12.

FIG. 18 illustrates the device room temperature lifetime at a constant dc current density of 40 mA/cm$^2$ for the non-blocked green structures in examples 1 and 3 having the 2,7-DCP: Ir(3'-Meppy)$_3$ or CBP: Ir(3'-Meppy)$_3$ emissive layer. FIG. 19 illustrates the room temperature device lifetime at a constant dc current density from an initial luminance of 1000 cd/m$^2$ for the non-blocked green structures in example 1 having the 2,7-DCP: Ir(3'-Meppy)$_3$ emissive layer. The dashed portion of the plot in FIG. 19 is extrapolated from the measured data points. These figures demonstrate that the non blocked green phosphorescent OLED device has good operational lifetime.

As demonstrated in FIG. 19, for a non-blocked green structures, embodiments of the invention may achieve commercially acceptable lifetimes, i.e., >3,000 hours to 80% of initial display luminance of 1,000 cd/m$^2$ (measured), or >10,000 hours to 50% of a initial display luminance of 1,000 cd/m$^2$ (extrapolated).

Although Ir(3'-Meppy)$_3$ is used in these examples, it is believed that other phosphorescent materials such as Ir(5-Phppy)$_3$ would achieve similar results. Likewise, other hosts such as those presented in Table 1 may be used.

As demonstrated by these results, DCP is a better electron-transporting host than the conventional CBP. Accordingly, non-blocking structures with a DCP host are about 30% more efficient as compared to their CBP host analogs.

Further refinement of these examples to position the triplet recombination zone at the interface of the emissive layer with the hole transport layer may be experimentally achieved by adjusting layer thicknesses, materials, and host/dopant ratios, using for example the probe method described above.

The simple layered structure illustrated in FIGS. 1, 2, 6, 8, 11, and 12, and are provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1, 2, 6, 8, 11, and 12.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

The invention claimed is:

1. A device comprising:
   an anode and a cathode;
   an emissive layer disposed between and electrically connected to the anode and the cathode, the emissive layer comprising an organic host and an organic dopant;
   an organic hole transport layer between the anode and the emissive layer;
   an organic electron transport layer between the cathode and the emissive layer; and
   an electron injection layer between the cathode and the electron transport layer;
   wherein said electron transport layer is a single layer and is the only layer between the electron injection layer and the emissive layer,
   the HOMO level of the organic host is no more than 0.8 eV below the HOMO level of the hole transport layer,
   the LUMO level of the organic host is no more than 0.4 eV above the LUMO level of the electron transport layer, and
   the HOMO level of the electron transport layer is no more than 0.4 eV below the HOMO level of the host,
   the HOMO and LUMO levels being calculated by density functional calculation.

2. The device of claim 1, wherein there is a triplet recombination zone within the emissive layer not more than 10% of the thickness of the emissive layer away from an interface between the emissive layer with the hole transport layer.

3. The device of claim 1, further comprising a hole injection layer between the anode and the hole transport layer.

4. The device of claim 1, further comprising an electron blocking layer between the anode and the emissive layer.

5. The device of claim 1, wherein the dopant is an iridium (III) organometallic complex.

6. The device of claim 1, wherein the organic host comprises a carbazole moiety.

7. The device of claim 1, wherein the device has an external quantum efficiency of over 9.2% at 500 $cd/m^2$.

8. The device of claim 1, wherein the device has a lifetime of 3,000 hours or more to 80% of an initial luminance of 1000 $cd/m^3$.

9. The device of claim 1, wherein the device has a lifetime of 10,000 hours or more to 50% of an initial luminance of 1000 $cd/m^3$.

10. A consumer electronic device comprising:
    a screen comprising:
    an anode and a cathode;
    an emissive layer disposed between and electrically connected to the anode and the cathode, the emissive layer comprising an organic host and an organic dopant;
    an organic hole transport layer between the anode and the emissive layer;
    an organic electron transport layer between the cathode and the emissive layer; and
    an electron injection layer between the cathode and the electron transport layer;
    wherein said electron transport layer is a single layer and is the only layer between the electron injection layer and the emissive layer,
    the HOMO level of the organic host is no more than 0.8 eV below the HOMO level of the hole transport layer,
    the LUMO level of the organic host is no more than 0.4 eV above the LUMO level of the electron transport layer, and
    the HOMO level of the electron transport layer is no more than 0.4 eV below the HOMO level of the host,
    the HOMO and LUMO levels being calculated by density functional calculation.

11. The consumer electronic product of claim 10, wherein the product is selected from the group consisting of: a flat panel displays, a computer monitor, a television, a billboard, a light for interior or exterior illumination and/or signaling, a heads up display, a fully transparent display, a flexible display, a laser printer, a telephone, a cell phone, a personal digital assistant (PDA), a laptop computer, a digital camera, a camcorder, a viewfinder, a micro-display, a vehicle, a large area wall, a theater or stadium screen, and a sign.

12. A method of fabricating an emissive device, the method comprising:
   obtaining an anode and a cathode;
   fabricating an emissive layer between and electrically connected to the anode and the cathode, the emissive layer comprising an organic host and an organic dopant;
   fabricating an organic hole transport layer between the anode and the emissive layer;
   fabricating an organic electron transport layer between the cathode and the emissive layer; and
   fabricating an electron injection layer between the cathode and the electron transport layer;
   wherein said electron transport layer is a single layer and is the only layer between the electron injection layer and the emissive layer,
   the HOMO level of the organic host is no more than 0.8 eV below the HOMO level of the hole transport layer,
   the LUMO level of the organic host is no more than 0.4 eV above the LUMO level of the electron transport layer, and
   the HOMO level of the electron transport layer is no more than 0.4 eV below the HOMO level of the host,
   the HOMO and LUMO levels being calculated by density functional calculation.

13. The method of claim 12, wherein the fabricated layers create a triplet recombination zone within the emissive layer not more than 10% of the thickness of the emissive layer away from an interface between the emissive layer with the hole transport layer.

14. The method of claim 12, further comprising:
   fabricating a hole injection layer between the anode and the hole transport layer.

15. The method of claim 12, further comprising:
   fabricating an electron blocking layer between the anode and the emissive layer.

16. The method of claim 12, wherein the dopant is an iridium (III) organometallic complex.

17. The method of claim 12, wherein the organic host comprises a carbazole moiety.

18. The method of claim 12, wherein the fabricated device has an external quantum efficiency of over 9.2% at 500 $cd/m^2$.

19. The method of claim 12, wherein the fabricated device has a lifetime of 3,000 hours or more to 80% of an initial luminance of 1000 $cd/m^3$.

20. The method of claim 12, wherein the fabricated device has a lifetime of 10,000 hours or more to 50% of an initial luminance of 1000 $cd/m^3$.

* * * * *